(12) United States Patent
Zhang

(10) Patent No.: US 9,906,124 B2
(45) Date of Patent: Feb. 27, 2018

(54) REFERENCE VOLTAGE GENERATION CIRCUIT AND SEMICONDUCTOR DEVICE

(71) Applicant: FUJI ELECTRIC CO., LTD., Kawasaki-shi, Kanagawa (JP)

(72) Inventor: Yanzheng Zhang, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/418,007

(22) Filed: Jan. 27, 2017

(65) Prior Publication Data

US 2017/0141682 A1    May 18, 2017

Related U.S. Application Data

(63) Continuation of application No. PCT/JP2015/086129, filed on Dec. 24, 2015.

(30) Foreign Application Priority Data

Feb. 25, 2015 (JP) ................................ 2015-035052

(51) Int. Cl.
- *G05F 3/24* (2006.01)
- *H02M 3/07* (2006.01)
- *H03K 19/0175* (2006.01)
- *H02M 1/08* (2006.01)

(52) U.S. Cl.
CPC ............... *H02M 3/07* (2013.01); *G05F 3/24* (2013.01); *H02M 1/08* (2013.01); *H03K 19/017509* (2013.01)

(58) Field of Classification Search
CPC .. G05F 3/24; H02M 1/08; H02M 3/07; H03K 19/017509; H03K 19/0185
See application file for complete search history.

(56) References Cited

U.S. PATENT DOCUMENTS

| | | |
|---|---|---|
| 5,672,992 A | 9/1997 | Nadd |
| 5,689,208 A | 11/1997 | Nadd |
| 7,821,328 B2 * | 10/2010 | Hoque ..................... H02M 3/07 323/312 |
| 2010/0090754 A1 | 4/2010 | Furuya et al. |
| 2012/0287684 A1 | 11/2012 | Fahlenkamp |

FOREIGN PATENT DOCUMENTS

| | | |
|---|---|---|
| CN | 101888180 A | 11/2010 |
| GB | 2299904 A | 10/1996 |
| GB | 2339638 A | 2/2000 |
| JP | H08-336277 A | 12/1996 |
| JP | 2010-098804 A | 4/2010 |

* cited by examiner

*Primary Examiner* — Patrick O'Neill
(74) *Attorney, Agent, or Firm* — Rabin & Berdo, P.C.

(57) ABSTRACT

A reference voltage generation circuit includes a voltage dividing circuit, a transistor, and a capacitor. The voltage dividing circuit divides a power-supply voltage into a specified level to generate a predetermined voltage. The transistor has a gate applied with the predetermined voltage and a drain outputting, as a reference voltage, a voltage obtained by adding the predetermined voltage and a threshold voltage of the transistor. The capacitor bypasses the gate and source of the transistor. Moreover, one end of the capacitor is connected to the gate of the transistor, and the other end of the capacitor is connected to the source of the transistor and ground. Furthermore, an electric charge output source which outputs an electric charge is connected to the drain of the transistor.

9 Claims, 11 Drawing Sheets

REFERENCE VOLTAGE GENERATION CIRCUIT AND SEMICONDUCTOR DEVICE

CROSS-REFERENCE TO RELATED APPLICATION

This application is a continuation application of International Application PCT/JP2015/086129 filed on Dec. 24, 2015 which designated the U.S., which claims priority to Japanese Patent Application No. 2015-035052, filed on Feb. 25, 2015, the entire contents of which are incorporated herein by reference.

BACKGROUND OF THE INVENTION

1. Field of the Invention

The embodiment discussed herein relates to a reference voltage generation circuit and a semiconductor device.

2. Background of the Related Art

In recent years, a semiconductor device, called an IPS (Intelligent Power Switch) is under development, which is obtained by integrating, into one chip, a switch element using a power semiconductor element, a driver circuit for the switch element, its peripheral control circuit, its protection circuit, and the like.

The IPS is widely utilized in automotive electric systems, for example, such as a transmission, an engine, and a brake, and thus products achieving smaller size, higher performance, and higher reliability are desired.

As the conventional technique, there is proposed a technique for preventing a malfunction of a circuit by fixing a potential using the clamp breakdown voltage of a Zener diode (US Patent Application Publication No. 2012/0287684).

In a high-side IPS having a switch element interposed between the positive electrode of a power supply and a load, a voltage lower than a power-supply voltage by a specified level is generated and the voltage lowered by the specified level is supplied as an internal ground for driving the circuit inside the IPS.

Moreover, in the IPS, when the switch element is turned on, an electric charge is accumulated by a charge pump until a threshold voltage of the switch element is exceeded, and then the accumulated electric charge is applied to the gate of the switch element to turn on the switch element.

However, the charge pump performs an operation of accumulating an electric charge by repeating the charging and discharging of a capacitor at high speed using an oscillation circuit, and therefore due to this influence, conventionally the potential of the internal ground might significantly fluctuate. If the potential of the internal ground fluctuates, a circuit will malfunction to cause a reduction in quality.

SUMMARY OF THE INVENTION

According to an aspect, there is provided a reference voltage generation circuit including: a voltage dividing circuit which divides a power-supply voltage to generate a predetermined voltage; a transistor which has a gate applied with the predetermined voltage and a drain outputting, as a reference voltage, a voltage obtained by adding the predetermined voltage and a threshold voltage of the transistor; and a capacitor which bypasses the gate and source of the transistor, wherein one end of the capacitor is connected to the gate of the transistor and an output end of the voltage dividing circuit, and the other end of the capacitor is connected to the source of the transistor and ground, and wherein an electric charge output source which outputs an electric charge based on an oscillation operation is connected to the drain of the transistor.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1A:
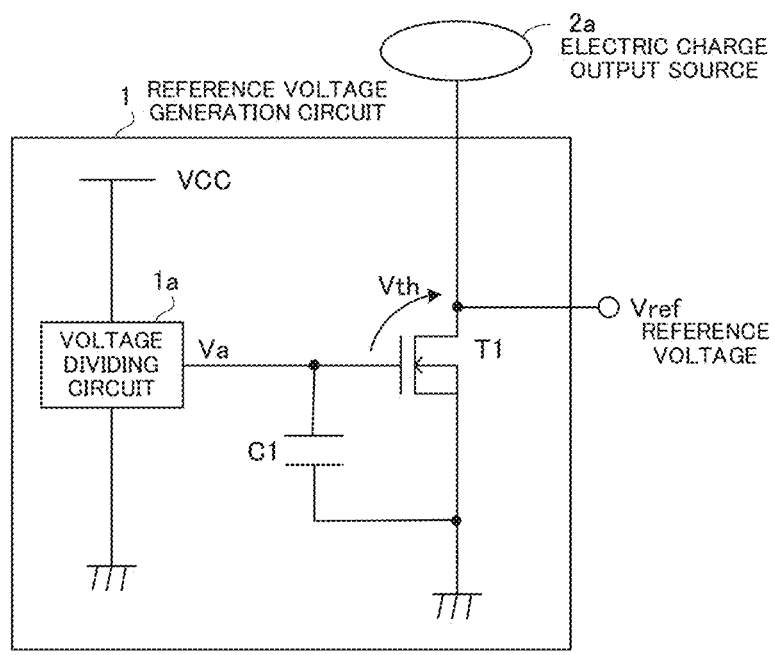
FIG. 1A illustrates a configuration example of a reference voltage generation circuit and FIG. 1B illustrates the operation.

Hereinafter, embodiments disclosed herein will be described with reference to the accompanying drawings. Note that, in this specification and the attached drawings, an element having substantially the same function may be given the same reference numeral to omit the duplicated description.

FIG. 1A illustrates a configuration example of a reference voltage generation circuit. A reference voltage generation circuit 1 includes a voltage dividing circuit 1a, a transistor T1, and a capacitor C1.

The voltage dividing circuit 1a divides a power-supply voltage VCC into a specified level to generate a predetermined voltage Va. The predetermined voltage Va is applied to the gate of the transistor T1, which outputs, as a reference voltage Vref from the drain, a voltage obtained by adding the predetermined voltage Va and a threshold voltage Vth of the transistor T1.

The capacitor C1 bypasses the gate and source of the transistor T1. In this case, one end of the capacitor C1 is connected to the gate of the transistor T1 and the output end of the voltage dividing circuit 1a, and the other end of the capacitor C1 is connected to the source of the transistor T1 and ground. Note that an electric charge output source 2a which outputs an electric charge is connected to the drain of the transistor T1.

Figure 1B:
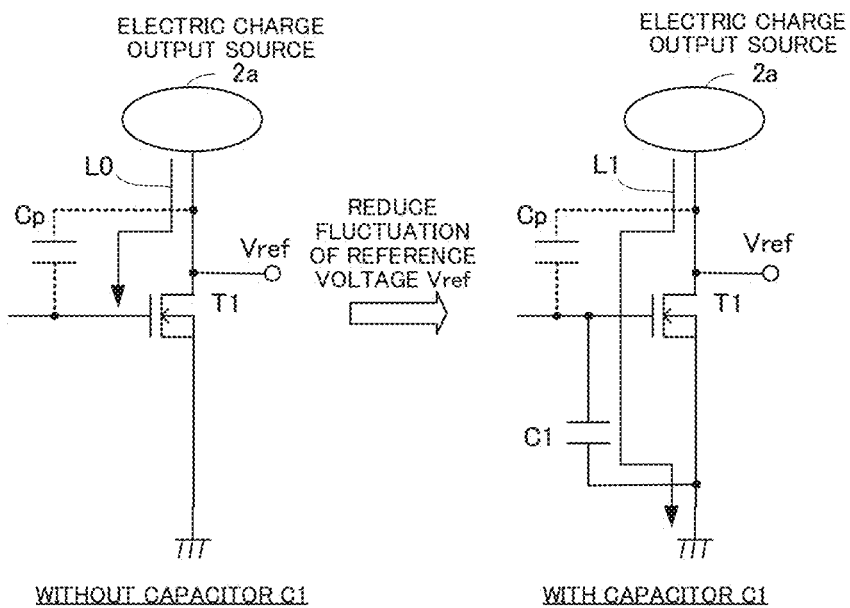

FIG. 1B illustrates the operation of the reference voltage generation circuit. Here, if there is no capacitor C1, an electric charge output from the electric charge output source 2a flows through a path L0, so that the gate of the transistor T1 accumulates an electric charge through a parasitic capacitor Cp between the gate and drain of the transistor T1.

Therefore, the potential of the reference voltage Vref will fluctuate with an increase or decrease of the electric charge output from the electric charge output source 2a.

In contrast, if there is the capacitor C1, a flow of an electric charge such as a path L1 is generated, and therefore an electric charge will not accumulate in the parasitic capacitor Cp between the gate and drain of the transistor T1, and the electric charge will be discharged to the ground.

Note that the electrostatic capacitance of the capacitor C1 is preferably set to be equal to or greater than the electrostatic capacitance of the parasitic capacitor Cp. Since the chip size is increased for increase of the electrostatic capacitance of the capacitor C1, the electrostatic capacitance of the capacitor C1 is preferably set to be the same as the electrostatic capacitance of the parasitic capacitor Cp in order to suppress the mounting scale.

This makes it possible to suppress a fluctuation of the potential of the reference voltage Vref. This also makes it possible to prevent the malfunction of a peripheral circuit to which the reference voltage Vref is supplied.

Figure 2:
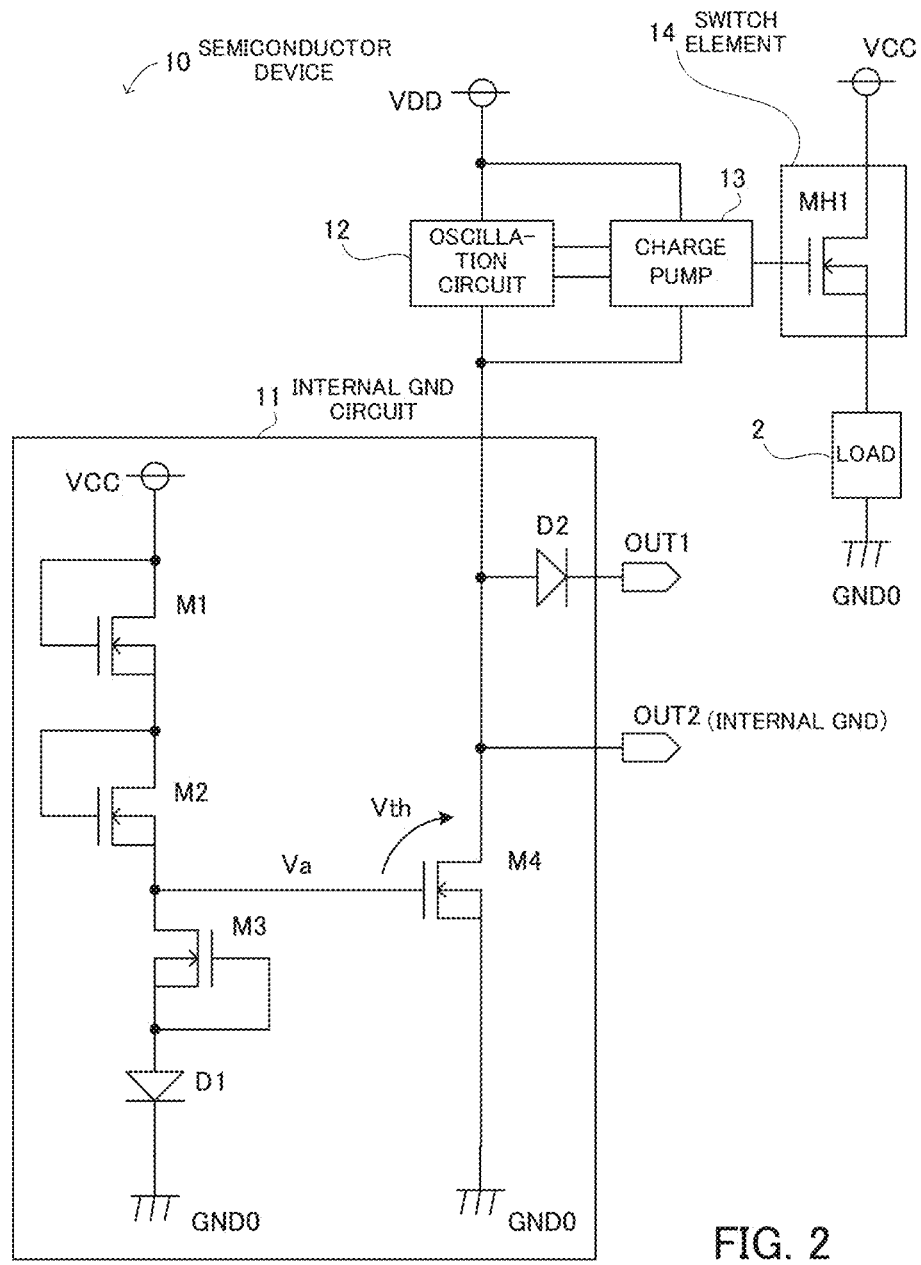
FIG. 2 illustrates a configuration example of a semiconductor device.
Figure 3:
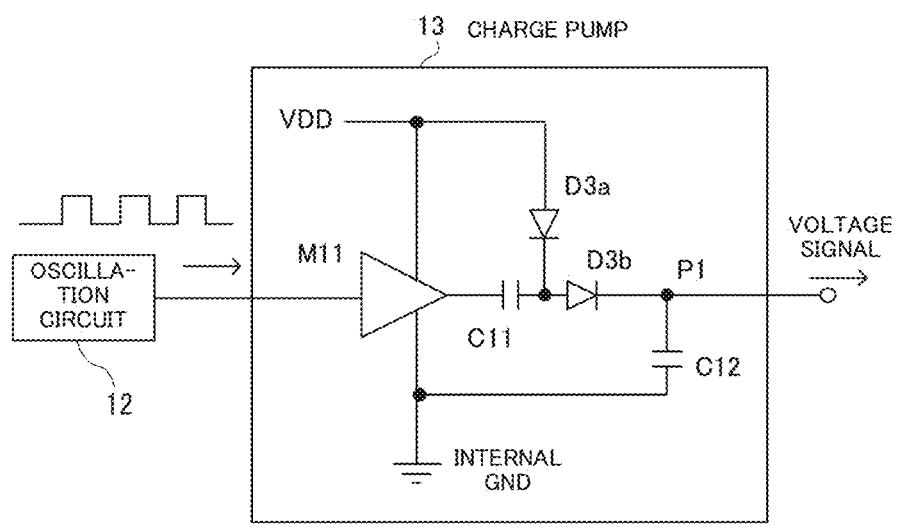
FIG. 3 illustrates the boosting operation of a charge pump.

Next, before the detailed description of the technique of the embodiment, a configuration of a general semiconductor device and its problem will be described using FIGS. 2 to 4. FIG. 2 illustrates a configuration example of the semiconductor device. GND0 in the diagram represents the usual GND of 0 V (hereinafter, the ground will be denoted by GND).

VCC represents an external power-supply voltage. VDD is a voltage needed for stably turning on each transistor inside the device, and is the power-supply voltage which is generated and supplied inside the device using VCC.

Moreover, for driving of each circuit inside the device, a reference voltage generated so as to be lower than the power supply VCC by a specified level will be hereinafter denoted by an internal GND (corresponding to the reference voltage Vref of FIGS. 1A, 1B).

A semiconductor device 10 is connected to a load 2, and includes an internal GND circuit 11, an oscillation circuit 12, a charge pump 13, and a switch element 14. The semiconductor device 10 is applicable to a high-side IPS, for example.

The internal GND circuit 11 includes NMOS transistors M1 to M4 which are N-channel MOSFETs (Metal Oxide Semiconductor Field Effect Transistors) and diodes D1 and D2. Moreover, for the switch element 14, an NMOS transistor MH1 is used as a power MOSFET.

Regarding the relation of connection among the respective circuit elements, the power supply VCC is connected to the drain of the NMOS transistor M1 and the gate of the NMOS transistor M1. The source of the NMOS transistor M1 is connected to the drain of the NMOS transistor M2 and the gate of the NMOS transistor M2.

The source of the NMOS transistor M2 is connected to the drain of the NMOS transistor M3 and the gate of the NMOS transistor M4. The gate of the NMOS transistor M3 is connected to the source of the NMOS transistor M3 and the anode of the diode D1, and the cathode of the diode D1 is connected to GND0.

The power supply VDD is connected to one power supply terminal of the oscillation circuit 12 and one power supply terminal of the charge pump 13. The oscillation circuit 12 and the charge pump 13 are connected to each other, and the output terminal of the charge pump 13 is connected to the gate of the NMOS transistor MH1.

The drain of the NMOS transistor MH1 is connected to the power supply VCC, the source of the NMOS transistor MH1 is connected to one end of the load 2, and the other end of the load 2 is connected to GND0.

Moreover, the other power supply terminal of the oscillation circuit 12 is connected to the other power supply terminal of the charge pump 13, the anode of the diode D2, an output terminal OUT2, and the drain of the NMOS transistor M4. The source of the NMOS transistor M4 is connected to GND0, and the cathode of the diode D2 is connected to an output terminal OUT1. Note that the other power supply terminal of the oscillation circuit 12 and the other power supply terminal of the charge pump 13 serve as terminals connected to the internal GND.

Here, the NMOS transistors M1 and M2 of the internal GND circuit 11 constitute a diode-connected transistor, and the NMOS transistor M3 and the diode D1 constitute a current lead-in section.

If the respective threshold voltages of the NMOS transistors M1 and M2 constituting the diode-connected transistor are denoted by Vth1, then in the example of the diagram, the potential of the source of the NMOS transistor M2 is (VCC−Vth1×2) because the diode-connected transistor is constituted by two stages, i.e, NMOS transistors M1 and M2.

Accordingly, this voltage will be output as the voltage Va obtained by dividing VCC. The divided voltage Va is applied to the gate of the NMOS transistor M4. Accordingly, if the threshold voltage of the NMOS transistor M4 is denoted by Vth, voltage (Va+Vth) is output from the drain of the NMOS transistor M4, and this voltage will be supplied, as the internal GND, to a peripheral circuit through the output terminal OUT2.

Note that the internal GND is supplied also to the oscillation circuit 12 and charge pump 13. Moreover, although the diode-connected transistor has a two-stage configuration in this example, it may be constituted by a desired number of stages.

Next, the problem to be solved will be described. In order for the NMOS transistor MH1, which is the main switch, to be fully turned on to drive the load 2, the gate voltage of the NMOS transistor MH1 needs a voltage of 28 V to be applied, for example.

In contrast, the power-supply voltage VCC of the semiconductor device 10 is 13 V, for example. Therefore, the charge pump 13 boosts, from VCC=13 V, the gate voltage by accumulating electric charges needed for fully turning on the NMOS transistor MH1.

Then, the charge pump 13 turns on the NMOS transistor MH1 by applying the boosted gate voltage to the gate of the NMOS transistor MH1.

Next, an example of the boosting operation of the charge pump 13 will be described. FIG. 3 illustrates the boosting operation of a charge pump. The charge pump 13 includes a buffer M11, diodes D3a and D3b, and capacitors C11 and C12.

The following describes the relation of connection among the respective components: the output end of the oscillation circuit 12 is connected to the input terminal of the buffer M11. One end of the capacitor C11 is connected to the output terminal of the buffer M11, and the other end of the capacitor C11 is connected to the cathode of the diode D3a and the anode of the diode D3b.

The anode of the diode D3a is connected to the power supply VDD. One end of the capacitor C12 is connected to the cathode of the diode D3b, and the other end of the capacitor C12 is connected to the internal GND.

Here, for example, in the case where an oscillation signal having an alternately repeated H level and L level is applied to the input terminal of the buffer M11, the buffer M11 outputs an L level when the oscillation signal is at an L level.

In this case, the capacitor C11 is charged from the power supply VDD (the terminal voltage of the capacitor C11 is charged up to VDD).

On the other hand, when the oscillation signal becomes an H level, the buffer M11 outputs an H level, and then the electric charge charged in the capacitor C11 will flow and move to the capacitor C12 through the diode D3b.

At this time, in the capacitor C12, the charging by the power supply VDD and the charging by the electric charge corresponding to the power supply VDD having flowed from the capacitor C11 are performed, and therefore the potential at a point P2 will rise up to twice VDD.

With such a configuration, an electric charge sufficient to fully turn on the NMOS transistor MH1 which is the switch element 14 is generated. Note that, in performing the boosting of n times VCC, in principle, n stages of the circuit configuration as described above will be provided.

Next, a fluctuation of the internal GND will be described. The charge pump 13 performs an operation of accumulating an electric charge by using the oscillation circuit 12 as the source of power and repeating the charging and discharging of a capacitor at high speed, as described above, and therefore due to this effect, a phenomenon of fluctuation of the potential of the internal GND will occur.

Figure 4:
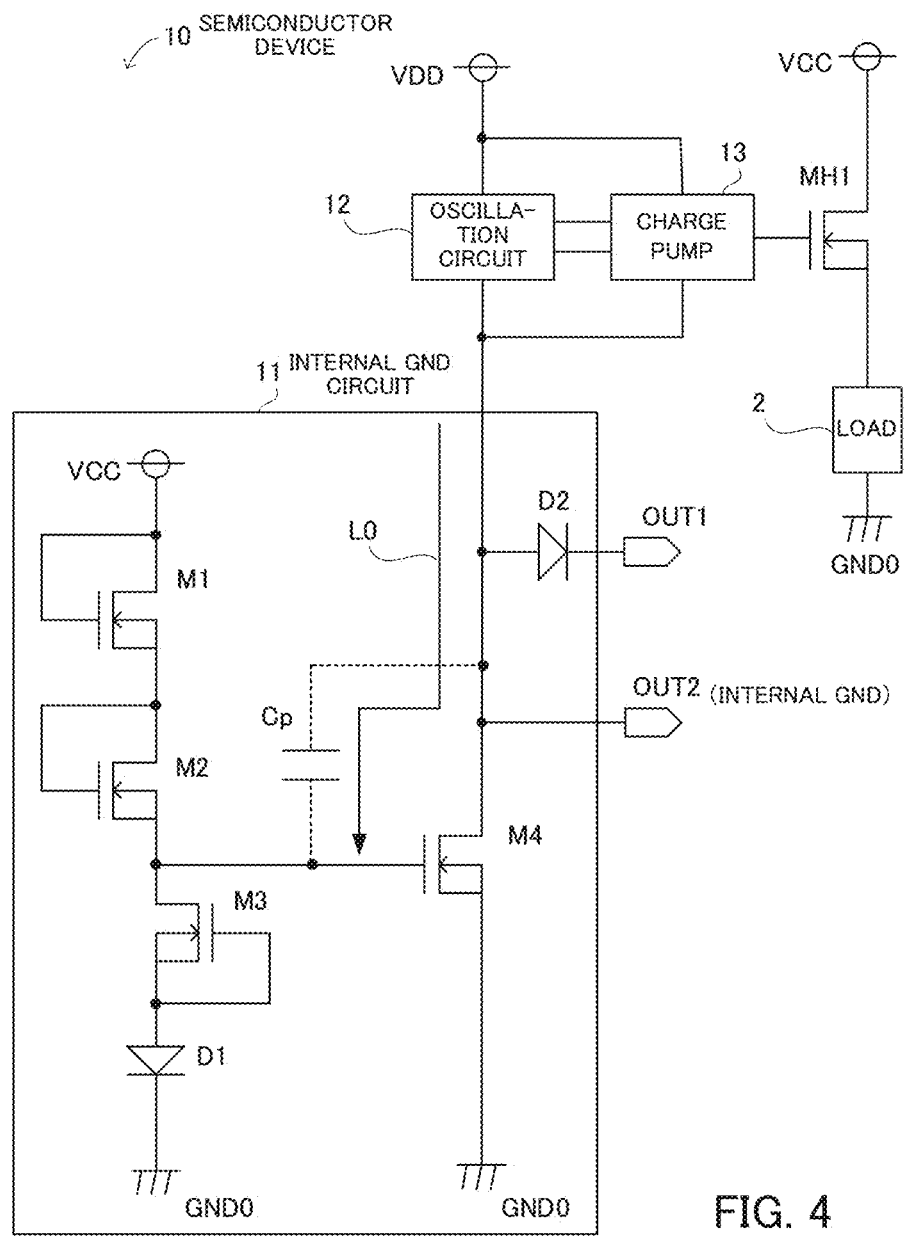
FIG. 4 is a diagram for explaining why an internal GND fluctuates.

FIG. 4 is a diagram for explaining why the internal GND fluctuates. In order to turn on the NMOS transistor MH1, the oscillation circuit 12 oscillates to actuate the charge pump 13.

Then, the electric charge applied to the gate of the NMOS transistor MH1 accumulates, and when the potential of the gate exceeds the threshold voltage of the NMOS transistor MH1, the NMOS transistor MH1 is turned on.

The charge pump 13 performs a rapid switching between charging and discharging, in order to accumulate an electric charge, as described above. At this time, through a path L0 (path through which an electric charge flows to the internal GND circuit 11 when the charge pump 13 is operating), and via a parasitic capacitor Cp between the drain terminal and gate terminal of the NMOS transistor M4, an electric charge accumulates at the gate of the NMOS transistor M4.

As the result, the gate potential of the NMOS transistor M4 will fluctuate with an increase or decrease of the electric charge output from the charge pump 13. Therefore, the conduction capability of the NMOS transistor M4 will vary and the drain potential of the NMOS transistor M4 will oscillate, i.e., the internal GND will fluctuate.

If the internal GND fluctuates, an EMI (Electro Magnetic Interference) noise is supplied to a peripheral circuit, and/or the operation accuracy of a circuit to which the internal GND is supplied will decrease, thereby causing a malfunction.

Note that, in the above-described conventional technique (US Patent Application Publication No. 2012/0287684), the potential is fixed by the clamp breakdown voltage of a Zener diode.

However, with this method, because the clamp breakdown voltage of a Zener diode needs to be adjusted so as to satisfy a specified potential, the number of processes for adjusting the clamp breakdown voltage will increase. Moreover, due to the manufacturing variation of the Zener diode, it may be difficult to fully control the oscillation width of the internal GND.

The present technology is established in view of the above and provides a reference voltage generation circuit and semiconductor device capable of reducing a fluctuation of the potential of the internal GND, suppressing an EMI noise and suppressing a decrease of the operation accuracy of a circuit, to which the internal GND is supplied, thereby preventing a malfunction of the circuit, without increasing the number of processes.

Figure 5:
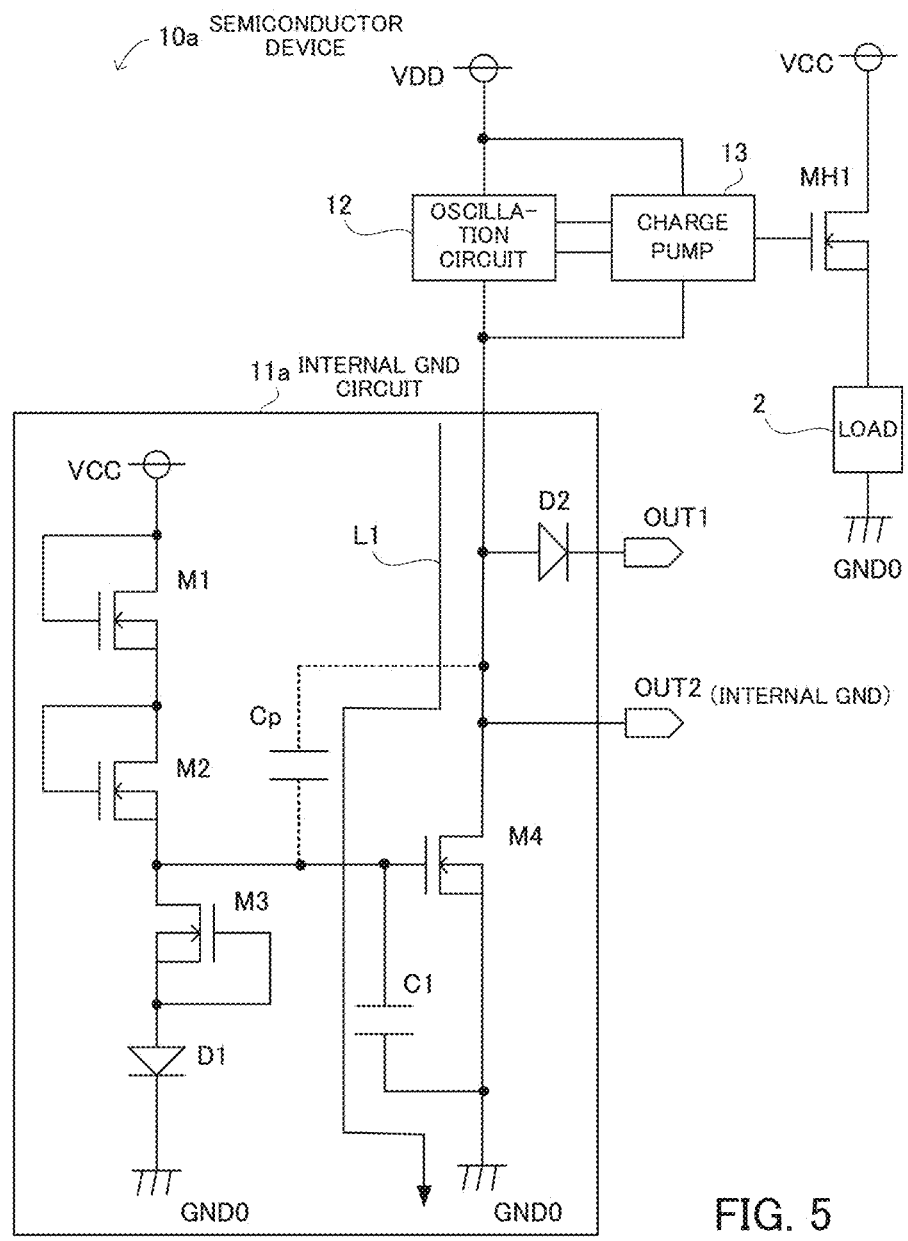
FIG. 5 illustrates a configuration example of a semiconductor device.

Next, a semiconductor device based on the technique of the embodiment will be described. FIG. 5 illustrates a configuration example of the semiconductor device. A semiconductor device 10a is connected to the load 2 and includes an internal GND circuit 11a, the oscillation circuit 12, the charge pump 13, and the switch element 14. Note that the internal GND circuit 11a has the function of the reference voltage generation circuit 1 illustrated in FIGS. 1A and 1B. Moreover, the oscillation circuit 12 and charge pump 13 correspond to the electric charge output source 2a illustrated in FIGS. 1A and 1B.

The internal GND circuit 11a includes a capacitor (bypass capacitor) C1 as a new circuit element. One end of the capacitor C1 is connected to the gate of the NMOS transistor M4, the source of the NMOS transistor M2, and the drain of the NMOS transistor M3. Moreover, the other end of the capacitor C1 is connected to the source of the NMOS transistor M4 and GND0. Other configurations are the same as those in FIG. 2.

In the semiconductor device 10a, the capacitor C1 is additionally connected between the gate and source of the NMOS transistor M4. Thus, the path L0 illustrated in FIG. 4 is bypassed to the source side of the NMOS transistor M4, i.e., to GND0, so that a path L1 will be generated as a new path through which the electric charge during operation of the charge pump 13 flows.

Accordingly, when the charge pump 13 is carrying out charging and discharging at high speed, it is possible to release to GND0 the electric charge which accumulates, through the path L1 and via the capacitor C1, into the gate of the NMOS transistor M4, thereby reducing the accumulation of an electric charge into the gate of the NMOS transistor M4.

Therefore, a fluctuation of the gate potential of the NMOS transistor M4 is suppressed and stabilized even when the charge pump 13 is operating. Accordingly, a change of the conduction capability of the NMOS transistor M4 is suppressed, and the oscillation of the drain potential of the NMOS transistor M4 is reduced, i.e., a fluctuation of the internal GND will decrease.

Figure 6:
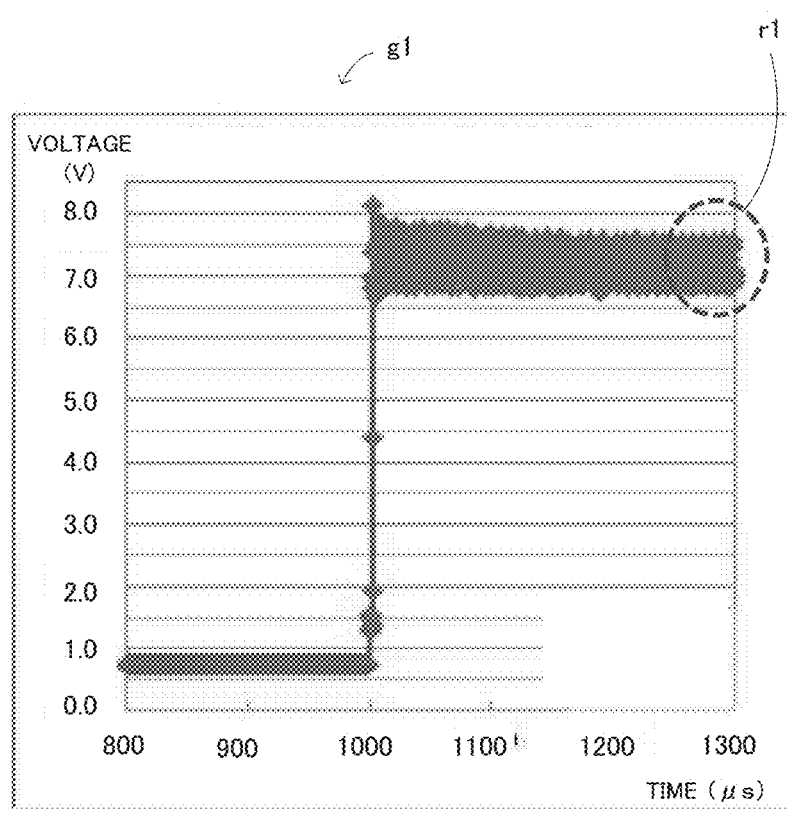
FIG. 6 illustrates the fluctuation of the internal GND.
Figure 7:
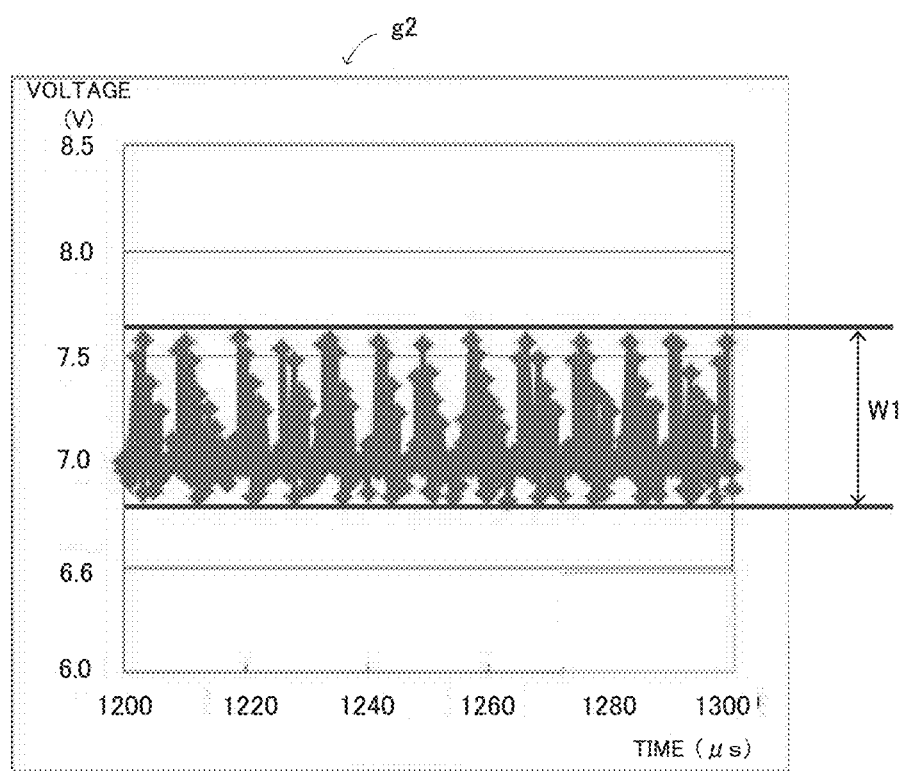
FIG. 7 illustrates the fluctuation of the internal GND.

Next, the simulation results of a fluctuation of the internal GND generated in the semiconductor devices 10 and 10a will be described. FIGS. 6 and 7 illustrate the fluctuation of the internal GND. The vertical axis represents voltage (V) while the horizontal axis represents time (μs).

A waveform g1 of FIG. 6 illustrates a simulation result of the fluctuation of the internal GND for the semiconductor device 10 prior to improvement. The charge pump 13 starts to output an electric charge at a time instance 1000 (μs).

Moreover, a waveform g2 of FIG. 7 is an enlarged view of the vicinity of a region r1 illustrated in FIG. 6. In the region r1, there is illustrated the state of the internal GND in a time band from time instances 1200 to 1300 (μs).

The internal GND (drain voltage of the NMOS transistor M4) of the semiconductor device 10 fluctuates in a range approximately from minimum 6.9 V to maximum 7.7 V at time instances 1200 to 1300 (μs), and therefore the oscillation width W1 is 0.8 V.

Figure 8:
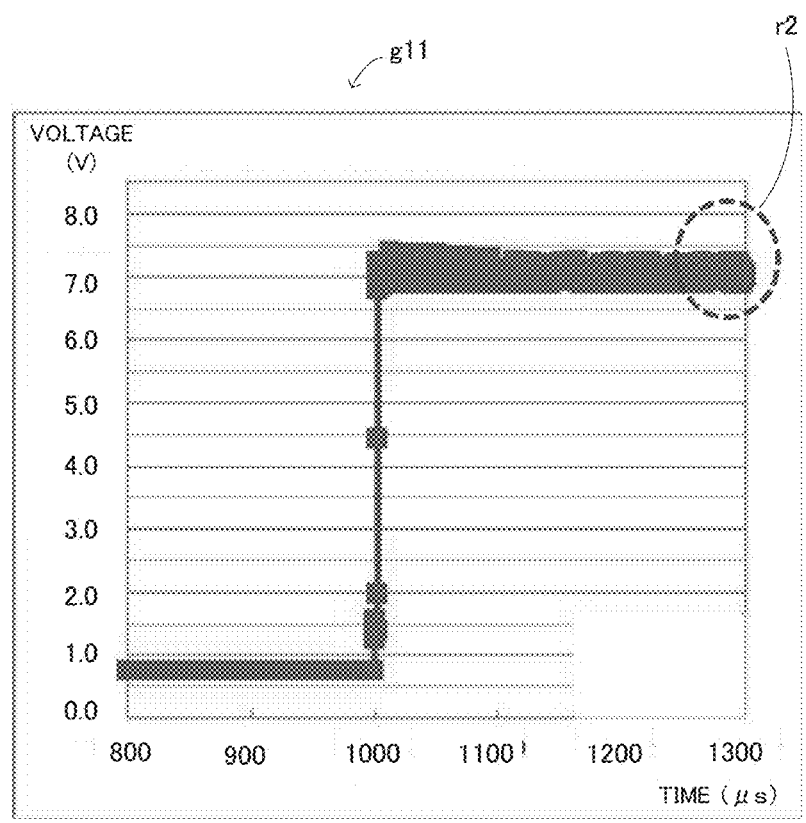
FIG. 8 illustrates the fluctuation of the internal GND.
Figure 9:
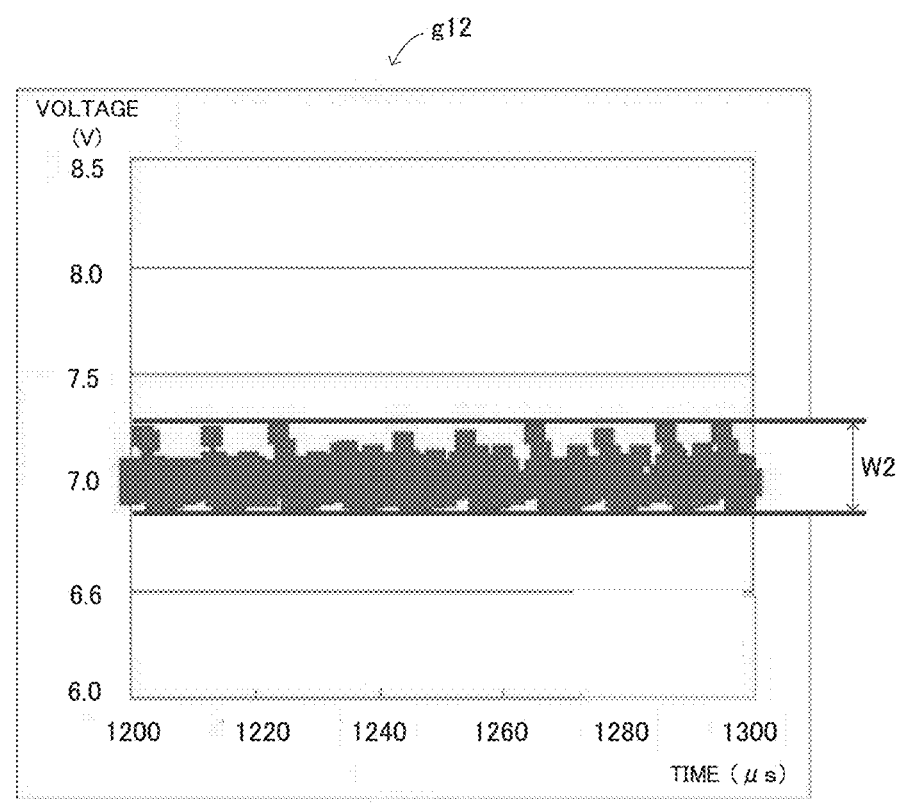
FIG. 9 illustrates the fluctuation of the internal GND.

FIGS. 8 and 9 illustrate the fluctuation of the internal GND. The vertical axis represents voltage (V) while the horizontal axis represents time (μs). A waveform g11 of FIG. 8 illustrates a simulation result of the fluctuation of the internal GND for the semiconductor device 10*a* after improvement. The charge pump 13 starts to output an electric charge at a time instance 1000 (μs).

Moreover, a waveform g12 of FIG. 9 is an enlarged view of the vicinity of a region r2 illustrated in FIG. 8. In the region r2, there is illustrated the state of the internal GND in a time band from time instances 1200 to 1300 (μs).

The internal GND (drain voltage of the NMOS transistor M4) of the semiconductor device 10*a* fluctuates in a range approximately from minimum 7.0 V to maximum 7.4 V at time instances 1200 to 1300 (μs), and therefore the oscillation width W2 is 0.4 V.

As described above, the simulation confirms that the semiconductor device 10*a* is capable of reducing the oscillation width of the internal GND down to a half of the oscillation width of the internal GND of the semiconductor device 10.

Figure 10:
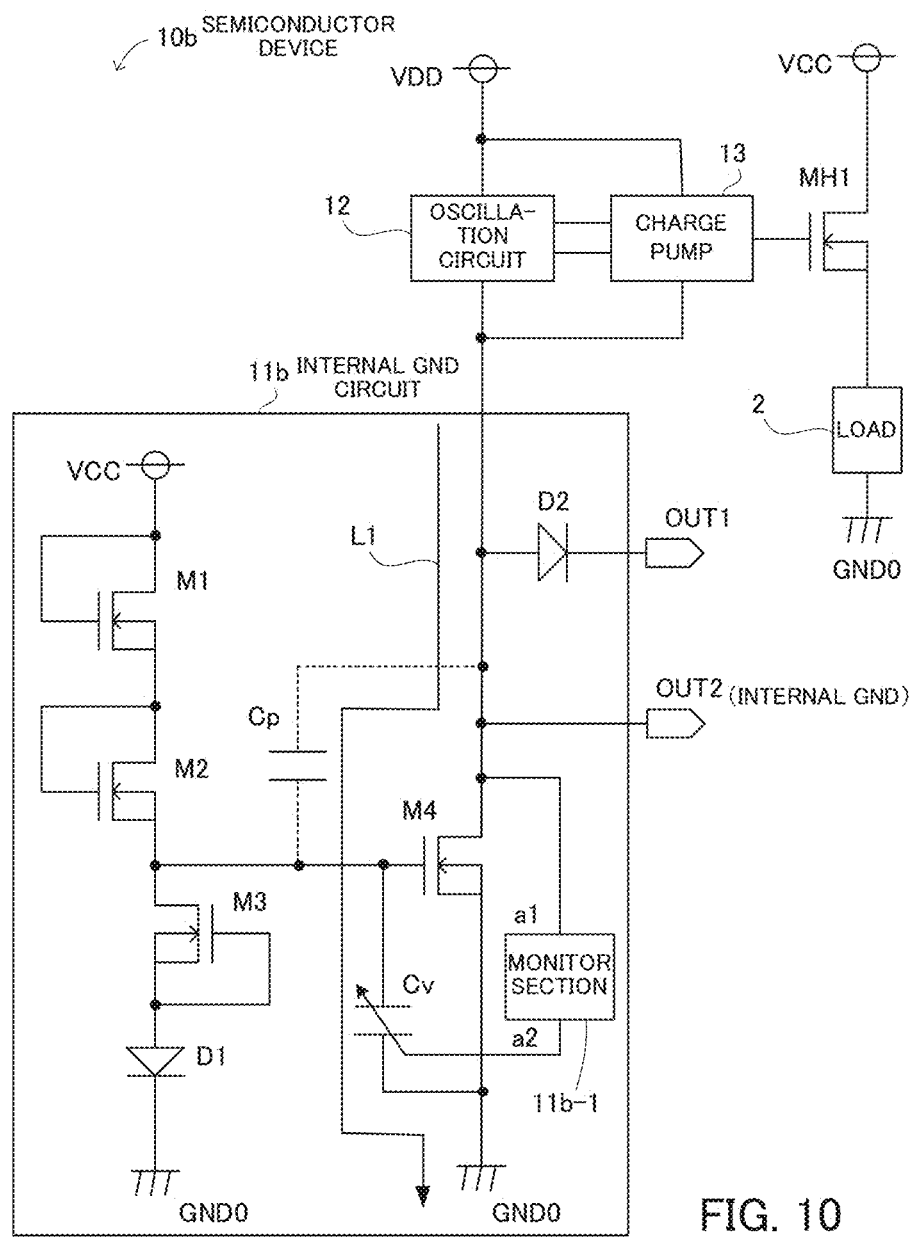
FIG. 10 illustrates a configuration example of a variation of the semiconductor device.

Next, a variation will be described. FIG. 10 illustrates the configuration example of the variation of the semiconductor device. A semiconductor device 10*b* is connected to the load 2 and includes an internal GND circuit 11*b*, the oscillation circuit 12, the charge pump 13, and the switch element 14. Note that the internal GND circuit 11*b* includes a variable capacitor Cv instead of the capacitor C1 illustrated in FIG. 5 and further includes a monitor section 11*b*-1.

An input terminal a1 of the monitor section 11*b*-1 is connected to the other power supply terminal of the oscillation circuit 12, the other power supply terminal of the charge pump 13, the anode of the diode D2, the terminal OUT2, and the drain of the NMOS transistor M4.

One end of the variable capacitor Cv is connected to the gate of the NMOS transistor M4, the source of the NMOS transistor M2, and the drain of the NMOS transistor M3. Moreover, the other end of the variable capacitor Cv is connected to the source of the NMOS transistor M4 and GND0. Furthermore, a variable capacitance adjusting terminal of the variable capacitor Cv is connected to a terminal a2 of the monitor section 11*b*-1. Other configurations are the same as those in FIG. 5.

The monitor section 11*b*-1 monitors the peak value and bottom value of the internal GND to calculate the amplitude of the internal GND. Then, the capacitance of the variable capacitor Cv is adjusted so that the calculated amplitude of the internal GND falls within a predetermined threshold. With such a configuration, it becomes possible to reduce the fluctuation of the internal GND.

Note that, in the case of the variation, because an appropriate capacitance of the bypass capacitor may be set in accordance with the amplitude of the internal GND, an electric charge may be prevented from being unnecessarily discharged to GND0.

Figure 11:
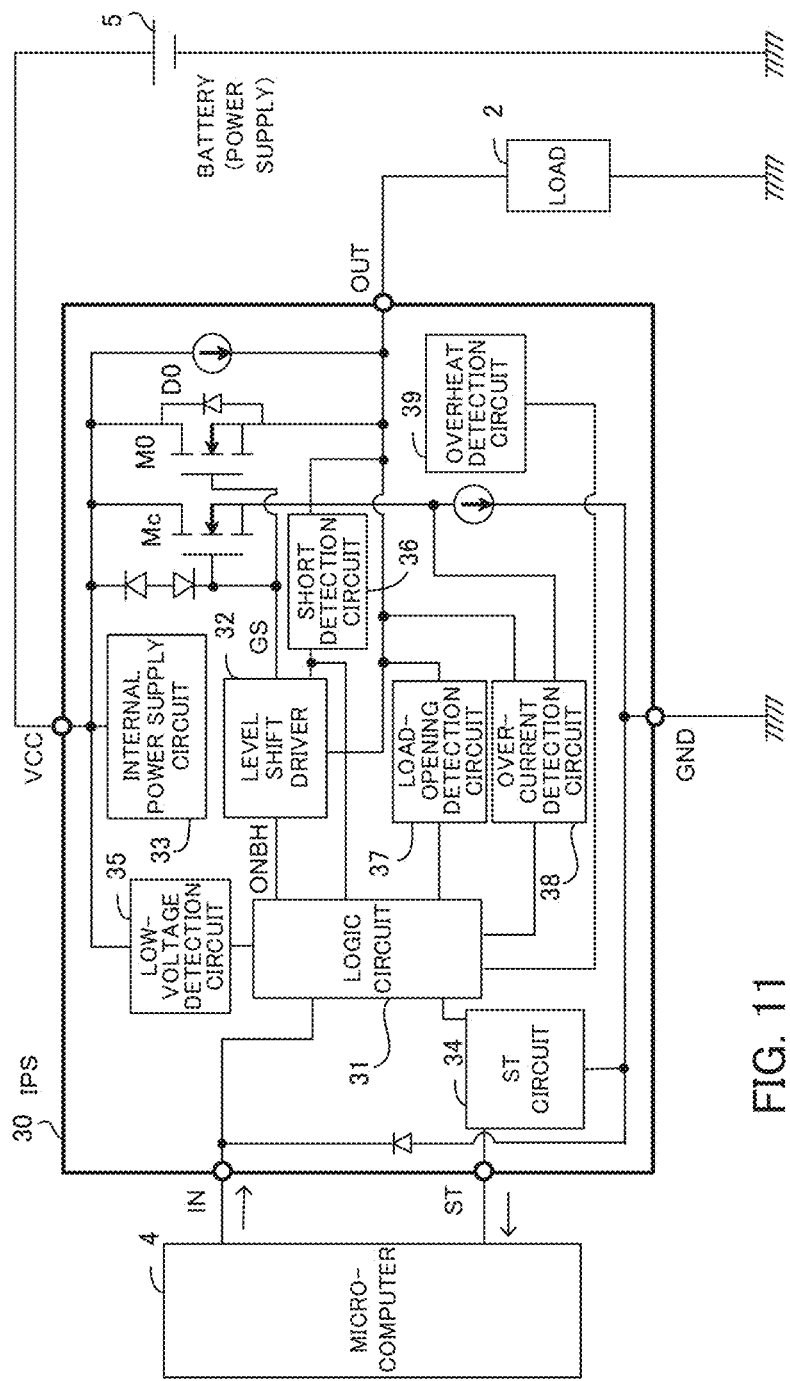
FIG. 11 illustrates a configuration example of a high-side IPS.

Next, the configuration of an IPS to which the semiconductor devices 10*a* and 10*b* of the embodiments are applied will be described. FIG. 11 illustrates a configuration example of the high-side IPS.

An IPS 30 is connected to the load 2, a microcomputer 4, and a battery 5. Moreover, the IPS 30 includes a logic circuit 31, a level shift driver 32, an internal power supply circuit 33, an ST (status) circuit 34, a low-voltage detection circuit 35, a short detection circuit 36, a load-opening detection circuit 37, an overcurrent detection circuit 38, and an overheat detection circuit 39.

Furthermore, the IPS 30 includes a switch element M0 for driving the load 2, and the switch element M0 has a diode D0 (FWD: Free Wheel Diode) connected thereto (switch element M0 corresponds to the above-described NMOS transistor MH1).

At the moment that the switch element M0 is turned off, a counter-electromotive force is generated from the inductive load 2, such as a motor. Therefore, the diode D0 is connected in antiparallel with the switch element M0 to re-circulate the load current at this time.

Here, the logic circuit 31 collectively recognizes a control signal from the microcomputer 4, the control signal being input from a terminal IN, and a state detection signal of each protection circuit, and outputs an ONBH (ON By H) signal for controlling the switch element M0.

The level shift driver 32 boosts the ONBH signal output from the logic circuit 31 to a level needed for fully turning on the switch element M0 to generate a GS signal, and applies the GS signal to the gate of the switch element M0. Note that the level shift driver 32 has the functions of the above-described oscillation circuit 12 and charge pump 13.

The internal power supply circuit 33 generates an internal power supply voltage which is a power-supply voltage stepwisely increased from a value lower than the VCC voltage, and provides the internal power supply to a circuit which needs to be controlled under the internal power supply. Note that, the internal power supply circuit 33 has the function of the internal GND circuits 11*a*, 11*b* illustrated in FIGS. 5 and 10.

The ST circuit 34 transmits a signal indicative of an operation state of the switch element M0 to the microcomputer 4 via an ST terminal.

The low-voltage detection circuit 35 transmits an abnormal signal to the logic circuit 31 when the VCC voltage is lower than a rated voltage. The logic circuit 31, which has received the abnormal signal transmitted from the low-voltage detection circuit 35, turns the ONBH signal for controlling the switch element M0 into a turn-off signal and outputs the same.

The short detection circuit 36 transmits an abnormal signal to the logic circuit 31 when the output terminal OUT connected to the source of the switch element M0 is shorted to GND. The logic circuit 31, which has received the abnormal signal transmitted from the short detection circuit 36, turns the ONBH signal for controlling the switch element M0 into a turn-off signal and outputs the same.

The load-opening detection circuit 37 transmits an abnormal signal to the logic circuit 31 when the output terminal OUT connected to the source of the switch element M0 is opened. The logic circuit 31, which has received the abnormal signal transmitted from the load-opening detection circuit 37, turns the ONBH signal for controlling the switch element M0 into a turn-off signal and outputs the same.

The overcurrent detection circuit 38 receives a current in a mirror ratio between the switch element M0 and a transistor Mc, from the transistor Mc which constitutes a current mirror circuit together with the switch element M0. Then, upon detection of a flow of an abnormal current larger than the rated current, the overcurrent detection circuit 38 transmits an abnormal signal to the logic circuit 31. The logic circuit 31, which has received the abnormal signal transmitted from the overcurrent detection circuit 38, turns the ONBH signal for controlling the switch element M0 into a turn-off signal and outputs the same.

The overheat detection circuit 39 transmits an abnormal signal to the logic circuit 31 when the switch element M0 reaches an abnormal temperature higher than a rated temperature. The logic circuit 31, which has received the abnormal signal transmitted from the overheat detection circuit 39, turns the ONBH signal for controlling the switch element M0 into a turn-off signal and outputs the same.

As described above, according to the embodiments, it is possible to reduce the fluctuation of the potential of the internal GND, suppress an EMI noise and suppress a decrease of the operation accuracy of a circuit, to which the internal GND is supplied, thereby preventing a malfunction of the circuit, without increasing the number of processes.

According to an aspect, it is possible to reduce a fluctuation of the potential of the internal ground and prevent a malfunction of a circuit.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A reference voltage generation circuit comprising:
   a voltage dividing circuit which divides a power-supply voltage to generate a predetermined voltage;
   a transistor which has a gate applied with the predetermined voltage and a drain outputting, as a reference voltage, a voltage obtained by adding the predetermined voltage and a threshold voltage of the transistor; and
   a capacitor which bypasses the gate and source of the transistor,
   wherein one end of the capacitor is connected to the gate of the transistor and an output end of the voltage dividing circuit, and the other end of the capacitor is connected to the source of the transistor and ground, and
   wherein an electric charge output source which outputs an electric charge based on an oscillation operation is connected to the drain of the transistor.

2. The reference voltage generation circuit according to claim 1, wherein the electric charge output source includes an oscillation circuit and a charge pump which repeats charging and discharging by an oscillation operation of the oscillation circuit.

3. The reference voltage generation circuit according to claim 1, wherein the capacitor discharges the electric charge, which is accumulated into the gate of the transistor, to the ground via a parasitic capacitor between the gate and drain of the transistor.

4. The reference voltage generation circuit according to claim 1, further comprising a monitor section which monitors an amplitude of the reference voltage,
   wherein the capacitor is a variable capacitor having a variable capacitance, and
   wherein the monitor section adjusts a capacitance of the variable capacitor so that the amplitude of the reference voltage falls within a predetermined value.

5. A semiconductor device comprising:
   a switch element to actuate a load;
   an electric charge output source including:
      an oscillation circuit; and
      a charge pump which repeats charging and discharging by an oscillation operation of the oscillation circuit and accumulates an electric charge until a drive voltage needed for turning on the switch element is reached; and
   a reference voltage generation circuit including:
      a voltage dividing circuit which generates a predetermined voltage by dividing a power-supply voltage;
      a transistor which has a gate applied with the predetermined voltage and a drain outputting, as a reference voltage, a voltage obtained by adding the predetermined voltage and a threshold voltage of the transistor; and
      a capacitor for bypassing a gate and source of the transistor,
   wherein one end of the capacitor is connected to the gate of the transistor and an output end of the voltage dividing circuit, and the other end of the capacitor is connected to the source of the transistor and ground, and
   wherein the electric charge output source is connected to the drain of the transistor.

6. A semiconductor device comprising:
   a semiconductor switch element;
   a reference voltage generation circuit comprising:
      a voltage dividing circuit which divides a power-supply voltage to generate a predetermined voltage;
      a transistor connected to the voltage dividing circuit to receive the predetermined voltage on a gate of the transistor, and configured to output, as a reference voltage, a voltage obtained by adding the predetermined voltage and a threshold voltage of the transistor from a drain of the transistor; and
      a capacitor having one end connected to the gate of the transistor and an output end of the voltage dividing circuit and the other end of the capacitor connected to the source of the transistor and ground; and
   an electric charge output source connected to the drain of the transistor and configured to output an electric charge to the semiconductor switch element based on an oscillation operation.

7. The semiconductor device according to claim 6, wherein the electric charge output source includes an oscillation circuit and a charge pump which repeats charging and discharging by an oscillation operation of the oscillation circuit.

8. The semiconductor device according to claim 6, wherein the capacitor discharges the electric charge, which is accumulated into the gate of the transistor, to the ground via a parasitic capacitor between the gate and drain of the transistor.

9. The semiconductor device according to claim 6, further comprising a monitor section which monitors an amplitude of the reference voltage,
   wherein the capacitor is a variable capacitor having a variable capacitance, and
   wherein the monitor section adjusts a capacitance of the variable capacitor so that the amplitude of the reference voltage falls within a predetermined value.

* * * * *